(12) United States Patent
Lin et al.

(10) Patent No.: US 6,358,773 B1
(45) Date of Patent: Mar. 19, 2002

(54) METHOD OF MAKING SUBSTRATE FOR USE IN FORMING IMAGE SENSOR PACKAGE

(76) Inventors: Vincent Lin, 4F, No. 12, 6 Long, 124 Lane, Sec. 1, Tong Ho East Street; Chi Ming Chang, 3F, No. 5, 120 Lane, East San Road, both of Taipei (TW)

( * ) Notice: Subject to any disclaimer, the term of this patent is extended or adjusted under 35 U.S.C. 154(b) by 0 days.

(21) Appl. No.: 09/748,231

(22) Filed: Dec. 27, 2000

(51) Int. Cl.[7] .................. H01L 21/44; H01L 21/48; H01L 21/50
(52) U.S. Cl. .................. 438/106; 438/126; 438/127
(58) Field of Search ................ 438/106, 126, 438/127

(56) References Cited

U.S. PATENT DOCUMENTS

| | | | |
|---|---|---|---|
| 5,750,423 A | * | 5/1998 | Ishii |
| 5,923,959 A | * | 7/1999 | Mess |
| 6,033,933 A | * | 3/2000 | Hur |
| 6,069,408 A | * | 5/2000 | Honda et al. |
| 6,168,970 B1 | * | 1/2001 | Burns |
| 6,172,423 B1 | * | 1/2001 | Lee |
| 6,284,565 B1 | * | 9/2001 | Tachibana et al. |
| 6,294,411 B1 | * | 9/2001 | Nishibayashi |
| 6,309,916 B1 | * | 10/2001 | Crowley et al. |

* cited by examiner

Primary Examiner—John F. Niebling
Assistant Examiner—Josetta Jones
(74) Attorney, Agent, or Firm—Lowe Hauptman Gilman & Berner, LLP

(57) ABSTRACT

A substrate manufacturing method comprises the steps of: (a) providing a molding die including a top mold and a bottom mold, the bottom mold being provided with at least two projections each having a recess; (b) closing and clamping the molding die on a lead frame in a manner that a chip-supporting member is positioned in a molding cavity defined in the molding die wherein the chip-supporting member has portions respectively engaged with the recess of each projection thereby assuring that a chip-supporting surface of the chip-supporting member is parallel to the lead frame; (c) transferring a thermoplastic material into the molding cavity; (d) hardening the thermoplastic material; and (e) unclamping and opening the molding die to take out the molded product. In the substrate manufacturing method of the present invention, since the chip-supporting member are engaged and immobilized by the projections of the bottom mold, transferring of thermoplastic material during step (c) will substantially have no effect on the chip-support member thereby assuring that the chip-supporting surface of the chip-supporting member is parallel to the lead frame.

7 Claims, 4 Drawing Sheets

METHOD OF MAKING SUBSTRATE FOR USE IN FORMING IMAGE SENSOR PACKAGE

BACKGROUND OF THE INVENTION

1. Field of the Invention

This invention relates to a substrate for use in forming an image sensor package and a method of making the substrate.

2. Description of the Related Art

In a typical imaging application, in order to protect the image sensing device in the form of an integrated circuit die, i.e., the image sensor chip, from physical damage and from contaminants in the surrounding environment, it is the practice to place the image sensor chip in a package which includes an opening sealed by a transparent lid thereby allowing the image sensor chip to be exposed to the object to be sensed on an optical principle.

In conventional packaging of these devices, the image sensor chip is mounted on a cofired ceramic substrate with protruding pins by means of an adhesive layer. Typically, the adhesive layer must be cured to fixedly attach the image sensor chip to the ceramic substrate. After wire-bonding and window sealing, the pins are cut to proper length and formed into proper configuration to complete the packaging process.

The ceramic package has many advantages such as low moisture permeability, high dimensional stability, a coefficient of thermal expansion (CTE) closely matching silicon and good thermal conductivity. However, the major disadvantage of the ceramic package is the cost. Therefore, the current trend in the packaging industry is shifting from the ceramic substrate-based packages to organic substrate-based packages because the organic substrate-based packages are less expensive to process and fabricate.

Typically, the image sensor chip is formed of microcrystalline silicon with a coefficient of thermal expansion (CTE) of about $33 \times 10^{-7}/°$ C. However, the organic substrate is usually formed of polymer impregnated fiberglass having a coefficient of thermal expansion of $250 \times 10^{-7}/°$ C. $-400 \times 10^{-7}/°$ C. Since there is a significant difference between the image sensor chip and the organic substrate in CTE, the image sensor chip and the organic substrate expand and contract in different amounts along with temperature fluctuations during the curing process of the adhesive layer. This causes warpage of the image sensor chip and the organic substrate thereby resulting in adverse influences that makes the chip unable to detect image. The higher curing temperature and longer curing time are employed, the greater warpage the image sensor chip and the organic substrate will produce. The warped organic substrate and chip will result in adverse influences on the chip itself and the subsequent manufacturing process. The thermal stress due to CTE mismatch may result in delamination between the chip and the substrate or chip cracking. Also, such differences in CTE could induce undesirable strains in the mechanical and electrical connections between the chip and the substrate The present invention therefore seeks to provide a substrate for packaging the image sensor chip which overcomes, or at least reduces the above-mentioned problems of the prior art.

SUMMARY OF THE INVENTION

It is an object of the present invention to provide a substrate for packaging an image sensor chip which mainly comprises a flat chip-supporting member embedded in a main body of thermoplastic material wherein the chip-supporting member is formed from materials with a CTE matching, and the substrate is characterized in that the bottom of the main body is provided with at least two cavities formed corresponding to the comers of the chip-supporting member.

It is another object of the present invention to provide a method of making a substrate for packaging an image sensor chip which utilizes a molding die capable of immobilizing the chip-support member to eliminate the effect of mold flow during molding thereby assuring the coplanarity of the chip-support member.

The substrate of the present invention mainly comprises a main body of thermoplastic material, a flat chip-supporting member embedded in the main body and a lead frame molded integrally with the main body. The lead frame includes a plurality of conductive leads having inner lead portions adapted for coupling to an image sensor chip and outer lead portions for making external electrical connection. The main body has a wall erected from the periphery thereof with a height taller than the height of the image sensor chip. The substrate is characterized in that the bottom of the main body is provided with at least two cavities formed corresponding to the comers of the chip-supporting member.

The present invention further provides a method of making the substrate in accordance with the present invention. The method comprises the steps of: (a) providing a molding die including a top mold and a bottom mold wherein the top mold and the bottom mold define a molding cavity shaped generally to conform to the to-be-molded shape of the substrate, the molding die being characterized in that the bottom mold is provided with at least two projections each having a recess; (b) providing a flat lead frame and a chip-supporting member having a flat chip-supporting surface adapted for receiving an image sensor chip; (c) closing and clamping the molding die on the lead frame in a manner that the chip-supporting member is positioned in the molding cavity wherein the chip-supporting member has portions respectively engaged with the recess of each projection thereby assuring that the chip-supporting surface thereof is parallel to the lead frame; (d) transferring a thermoplastic material into the molding cavity; (e) hardening the thermoplastic material; and (f) unclamping and opening the molding die to take out the molded product.

In the substrate manufacturing method of the present invention, since the comers of the chip-supporting member are engaged and immobilized by the projections of the bottom mold, transferring of thermoplastic material during step (d) will substantially have no effect on the chip-support member thereby assuring that the chip-supporting surface of the chip-supporting member is parallel to the lead frame.

BRIEF DESCRIPTION OF THE DRAWINGS

Other objects, advantages, and novel features of the invention will become more apparent from the following detailed description when taken in conjunction with the accompanying drawings.

DETAILED DESCRIPTION OF THE PREFERRED EMBODIMENT

Figure 1:
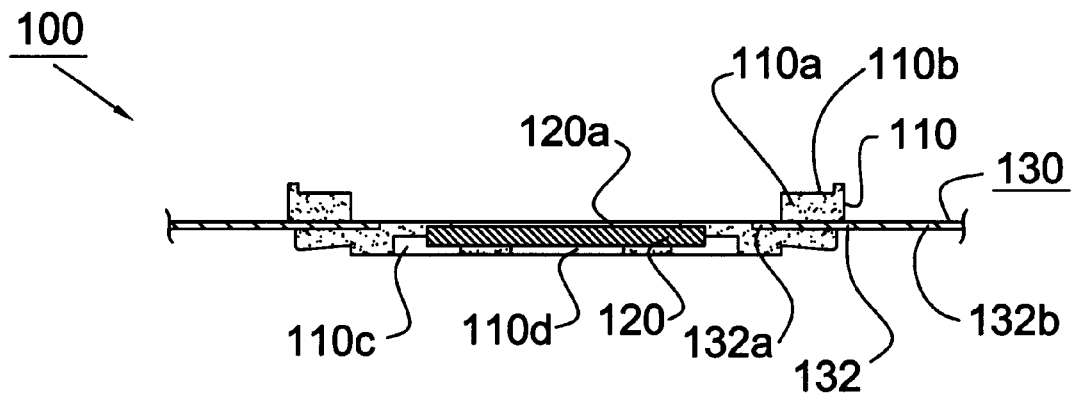
FIG. 1 is a cross-sectional view of a substrate for use in forming an image sensor package according to a preferred embodiment of the present invention.

FIG. 1 shows a substrate 100 for use in forming an image sensor package according to a preferred embodiment of the present invention. The substrate 100 mainly comprises a main body 110 of thermoplastic material, a flat chip-supporting member 120 embedded in the main body 110 and a lead frame 130 molded integrally with the main body. The lead frame 130 includes a plurality of conductive leads 132 having inner lead portions 132a adapted for coupling to an image sensor chip (not shown) and outer lead portions 132b for making external electrical connection. The main body 110 has a wall 110a erected from the periphery thereof with a height taller than the height of the image sensor chip. Preferably, an indentation 110b is provided in the wall 110a of the main body 110 for receiving a transparent cover (not shown). It is noted that the chip-supporting member 120 has a flat chip-supporting surface 120a for receiving the image sensor chip (not shown). The substrate 100 is characterized in that the bottom of the main body is provided with at least two cavities 110c formed corresponding to the corners of the chip-supporting member, and the chip-supporting surface 120a of the chip-supporting member 120 is parallel to the inner lead portions 132a of the conductive leads 132 of the lead frame. It should be understood that the bottom of the main body 110 preferably has a central cavity 110d such that a central portion of the chip-supporting member 120 is exposed through the main body 110 for enhancing the thermal performance.

Figure 2:
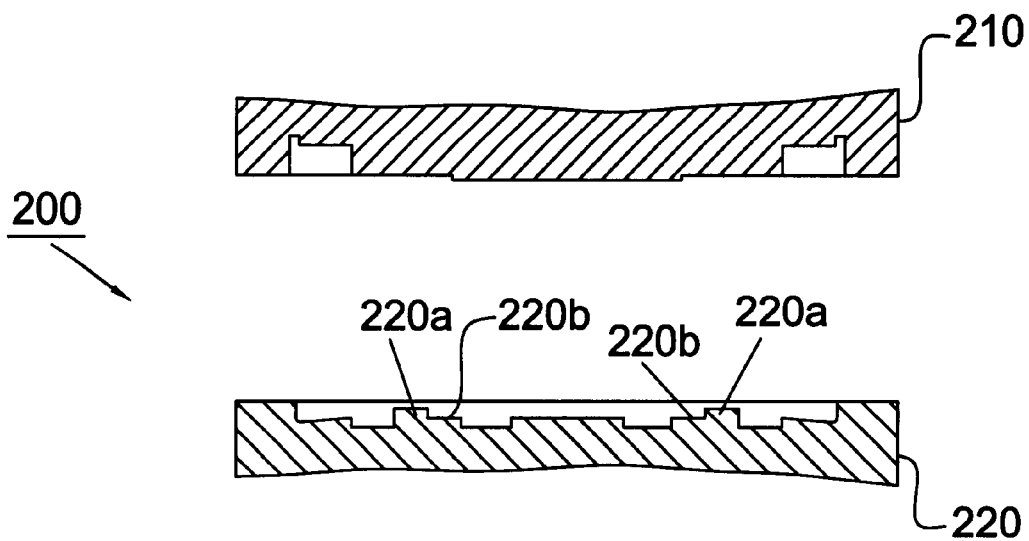
FIGS. 2–5 illustrate in cross-section major steps of a substrate manufacturing method according to a preferred embodiment of the present invention.
Figure 3A:
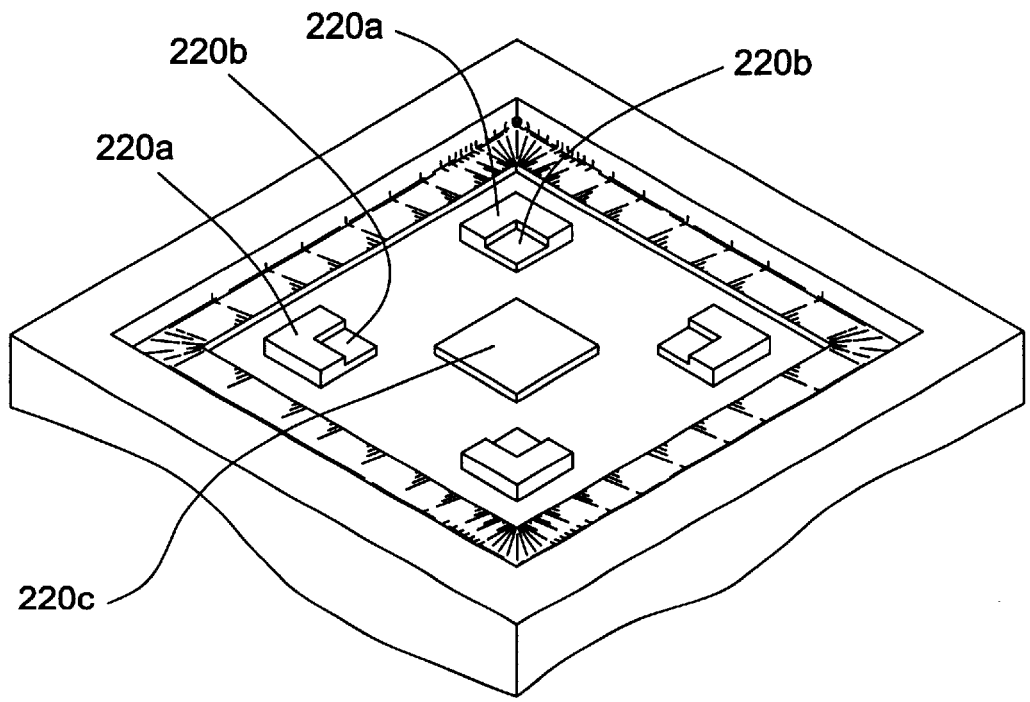

Preferably, the substrate of the present invention is formed by a conventional molding process such as insert molding. This is accomplished by the following steps of:

(a) providing a molding die 200 (see FIG. 2) including a top mold 210 and a bottom mold 220 wherein the two molds together define a molding cavity shaped generally to conform to the to-be-molded shape of the substrate. As shown in FIG. 3a, the molding die 200 is characterized in that the bottom mold 220 is provided with four projections each having a recess 220b. Preferably, the bottom mold 220 is further provided with a central bulge 220c.

Figure 3B:
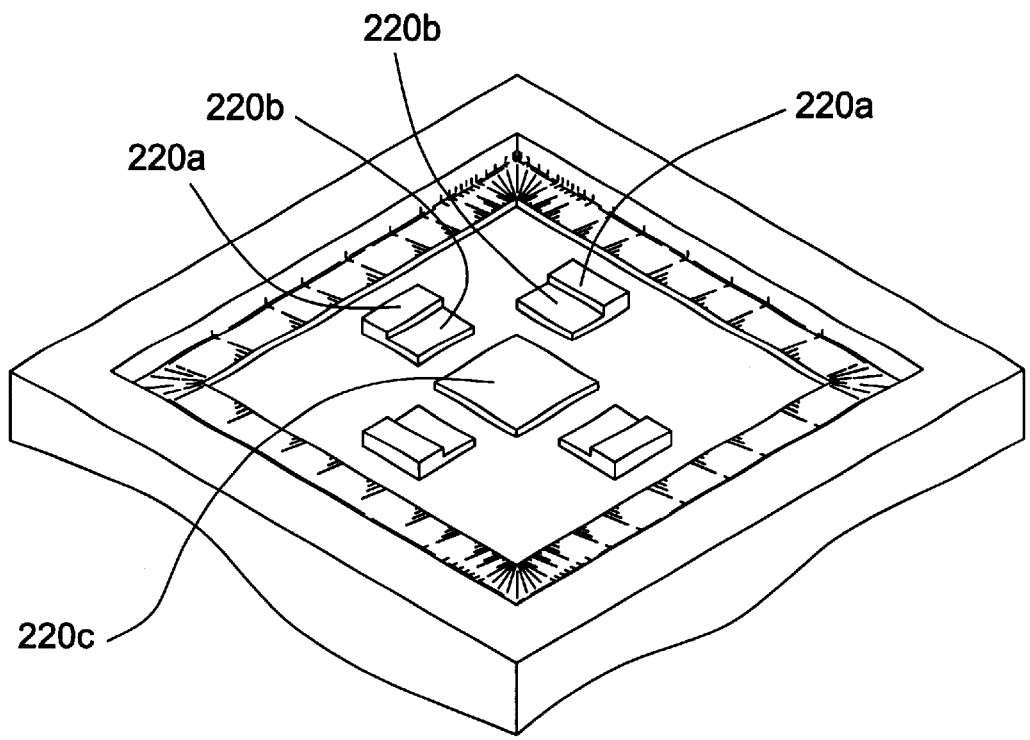

It should be understood that even though the projections 220a shown in the FIG. 3a are all disposed at the corner of the bottom mold 220, this is not necessary in practicing the present invention. Another preferred embodiment (see FIG. 3b) with the projections 220a not disposed at the corner of the bottom mold 220 is considered within the scope and spirit of the invention.

(b) providing a flat lead frame and a chip-supporting member having a flat chip-supporting surface adapted for receiving an image sensor chip.

Figure 4:
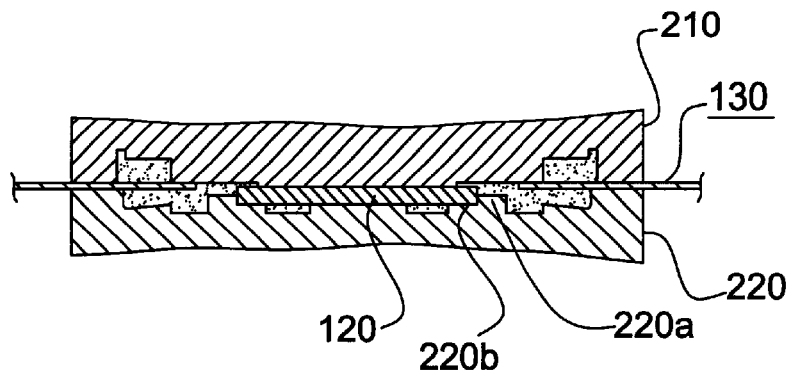
Figure 5:
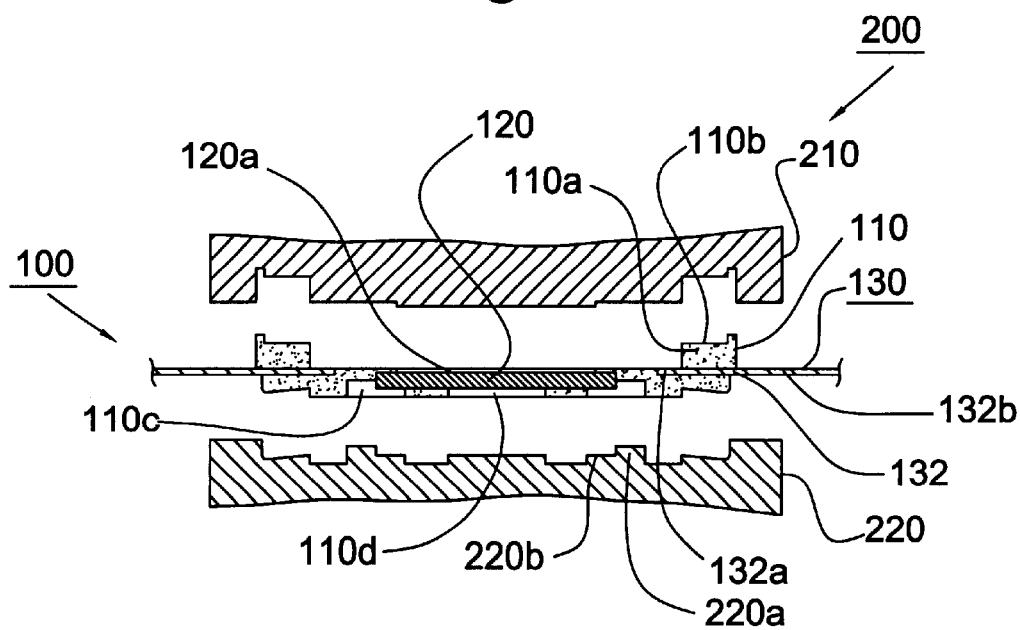

(c) closing and clamping the molding die 200 on the lead frame 130 in a manner that the chip-supporting member 120 is positioned in the molding cavity (see FIG. 4). As shown, the corners of the chip-supporting member 120 are respectively engaged with the recess 220b of each projection 220a thereby immobilizing the member 120 in the molding cavity.

(d) transferring a thermoplastic material into the molding cavity. Since the corners of the chip-supporting member 120 are engaged and immobilized by the projections 220a of the bottom mold 220, transferring of thermoplastic material during step (d) will substantially have no effect on the chip-support member thereby assuring that the chip-supporting surface 120a of the chip-supporting member is parallel to the lead frame. Preferably, the thermoplastic material is heat-resistant thermoplastic engineering plastics.

(e) hardening the thermoplastic material.

(f) unclamping and opening the molding die to take out the molded product.

The lead frame in accordance with the present invention is formed from a thin metal strip which has been etched or stamped to form the conductive leads. Preferably, the lead frame is made of copper or alloys containing copper. Alternatively, the lead frame is made of iron, nickel or alloys thereof, and then plated with copper. Preferably, the chip-supporting a member of the present invention is formed from materials with a CTE matching the CTE of the image sensor chip and has a hardness sufficient to provide good flatness. Furthermore, the chip-supporting member must have a good thermal conductivity for enhancing the thermal performance of the finished package. Preferably, the chip-supporting member has a coefficient of thermal expansion (CTE) ranging from about $20 \times 10^{-7}/°$ C. to about $100 \times 10^{-7}/°$ C. and a thermal conductivity ranging from about 10 W/m.K to about 600 W/m.K. Suitable materials for use in forming the chip-supporting member are ceramic materials, alumina ($Al_2O_3$) and glass materials (such as borosilicate glass).

Figure 6:
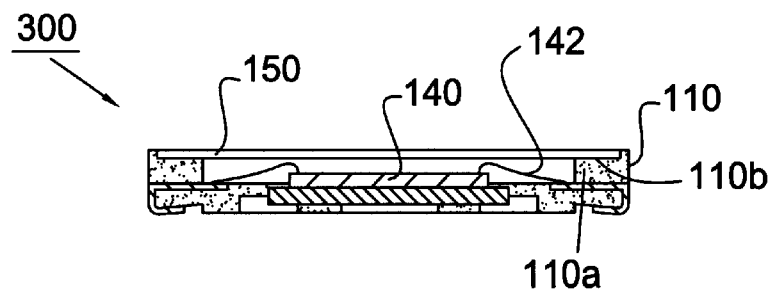
FIG. 6 is a cross-sectional view of an image sensor package according to a preferred embodiment of the present invention.

FIG. 6 shows an image sensor package 300 using the substrate 100 of FIG. 1 of the present invention. The image sensor chip 140 is attached to the chip-supporting member 120 integrally formed with the main body 110 by means of an adhesive layer (not shown). The image sensor chip 140 is electrically connected to the inner lead portions 132a of the conductive leads 132 of the lead frame 130 through a plurality of bonding wires such as gold wires 142. The conductive leads 132 of the lead frame 130 are trimmed such that parts of them still extend outwardly of the main body 110, which, in turn, are formed into standard lead configurations such as gull-wing, J-lead or the like. The image sensor package 300 is provided with a transparent cover 150 sealed over the top of the wall 110a of the main body 110 thereby allowing the image sensor chip 140 to be exposed to the object to be sensed (not shown). Preferably, the transparent cover 150 is an optically plastic lid or glass lid of high transparency.

In the optical communication, the air-tightness of an image sensor package is regarded as important for the purpose of securing a high reliability. In the substrate 100 of the present invention, the indentation 110b formed in the wall 110a of the main body 110 helps to maintain a closely engagement between the transparent cover 150 and the wall 110a thereby providing a better air-tightness.

Figure 7:
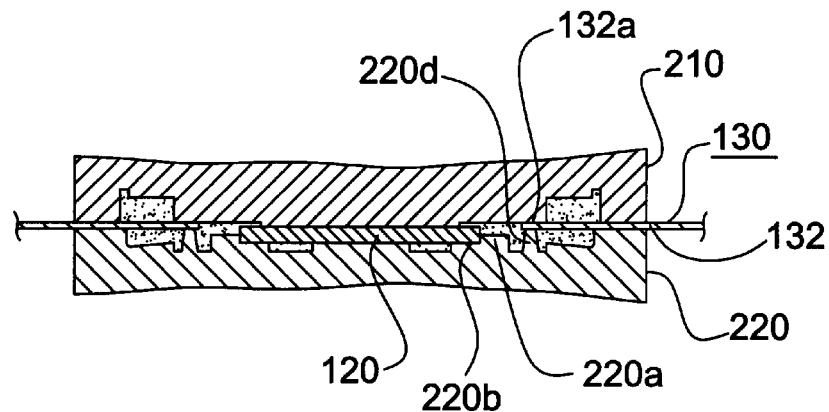
FIGS. 7–8 illustrate in cross-section major steps of a substrate manufacturing method according to another preferred embodiment of the present invention.

Referring to FIG. 7, since the inner lead portions 132a of the conductive leads 132 of the lead frame 130 are exposed from the surface of the molded substrate, flash problems tend to occur at the edge of the inner lead portions 132a, which may be fatal to the wire bonding reliability. Therefore, in this embodiment, the bottom mold 220 preferably has a plurality of pillar protrusions 220d disposed corresponding to the inner lead portions 132a of the leads 132. When the mold die 200 is closed and clamped on the lead frame 130, the pillar protrusions 220d of the bottom mold 220 can cooperate with the top mold 210 to significantly reduce the formation of flash during the molding process.

Figure 8:
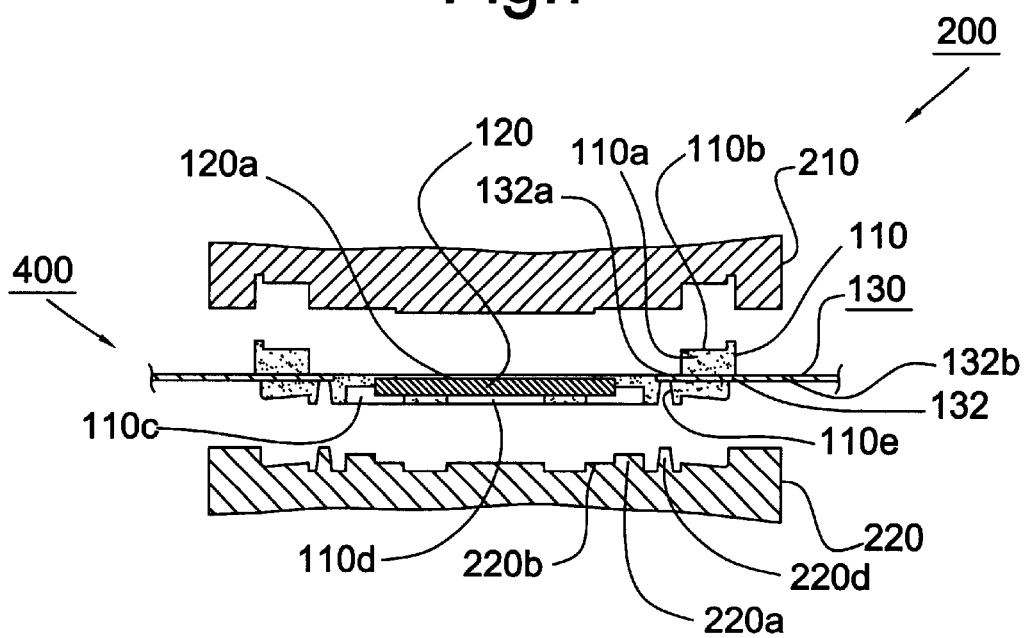

FIG. 8 shows a substrate 400 for use in forming an image sensor package according to another preferred embodiment of the present invention. The substrate 400 is characterized in that the bottom of the main body 110 has a plurality of holes 110e formed corresponding to the inner lead portions 132a of the conductive leads 132.

Figure 9:
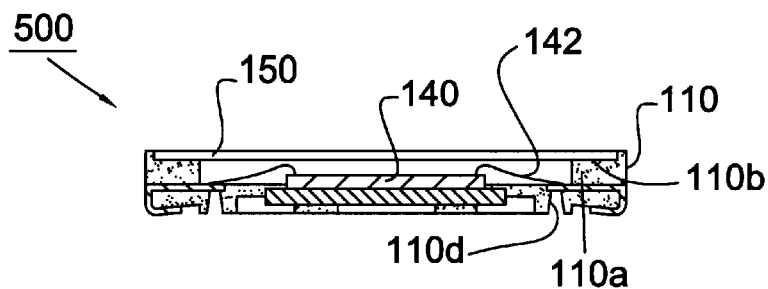
FIG. 9 is a cross-sectional view of an image sensor package according to another preferred embodiment of the present invention.

FIG. 9 shows an image sensor package 500 using the substrate 400 of FIG. 8 of the present invention. The image sensor package 400 is characterized in that the bottom of the main body 110 has a plurality of holes 110e formed corresponding to the inner lead portions 132a of the conductive leads 132.

In the substrate manufacturing method of the present invention, the corners of the chip-supporting member are engaged and immobilized by the projections of the bottom mold. This keep the chip-supporting surface of the chip-supporting member parallel to the lead frame thereby providing a reliable wire bonding in the following packaging process of the image sensor chip.

Although the invention has been explained in relation to its preferred embodiment, it is to be understood that many other possible modifications and variations can be made without departing from the spirit and scope of the invention as hereinafter claimed.

What is claimed is:

1. A method of making a substrate for use in forming an image sensor package comprising the steps of:

providing a molding die including a top mold and a bottom mold wherein the top mold and the bottom mold define a molding cavity shaped generally to conform to the to-be-molded shape of the substrate, the molding die being characterized in that the bottom mold is provided with at least two projections each having a recess;

providing a flat lead frame and a chip-supporting member having a flat chip-supporting surface adapted for receiving an image sensor chip;

closing and clamping the molding die on the lead frame in a manner that the chip-supporting member is positioned in the molding cavity wherein the chip-supporting member has portions respectively engaged with the recess of each projection thereby assuring that the chip-supporting surface thereof is parallel to the lead frame;

transferring a thermoplastic material into the molding cavity;

hardening the thermoplastic material;

unclamping and opening the molding die to take out the molded product.

2. The method as claimed in claim 1, wherein the chip-supporting member has a coefficient of thermal expansion (CTE) ranging from about $20 \times 10^{-7}/^\circ$ C. to about $100 \times 10^{-7}/^\circ$ C. and a thermal conductivity ranging from about 10 W/m.K to about 600 W/m.K.

3. The method as claimed in claim 2, wherein the chip-supporting member is formed of ceramic materials.

4. The method as claimed in claim 2, wherein the chip-supporting member is made of alumina ($Al_2O_3$).

5. The method as claimed in claim 2, wherein the chip-supporting member is formed of glass materials.

6. The method as claimed in claim 1, wherein the bottom mold further comprises a central bulge.

7. The method as claimed in claim 6, wherein the lead frame include a plurality of conductive leads having inner lead portions for coupling to the image sensor chip, and the bottom mold further comprises a plurality of pillar protrusions corresponding to the inner lead portions of the leads.

* * * * *